United States Patent
Takeshima et al.

(10) Patent No.: US 8,343,361 B2
(45) Date of Patent: Jan. 1, 2013

(54) METHOD FOR PRODUCING A THIN FILM LAMINATED CAPACITOR

(75) Inventors: Yutaka Takeshima, Nagaokakyo (JP); Masanobu Nomura, Tsukuba (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 329 days.

(21) Appl. No.: 12/813,774

(22) Filed: Jun. 11, 2010

(65) Prior Publication Data

US 2010/0252527 A1  Oct. 7, 2010

Related U.S. Application Data

(63) Continuation of application No. PCT/JP2008/070003, filed on Nov. 4, 2008.

(30) Foreign Application Priority Data

Dec. 14, 2007 (JP) ................. 2007-322945

(51) Int. Cl.
- *H01G 4/00* (2006.01)
- *H01G 5/00* (2006.01)
- *H01G 7/00* (2006.01)
- *H01G 9/00* (2006.01)
- *H01G 13/00* (2006.01)

(52) U.S. Cl. ............................ 216/6; 216/13

(58) Field of Classification Search ........... 216/6, 13; 361/306.3, 307
See application file for complete search history.

(56) References Cited

U.S. PATENT DOCUMENTS

| | | |
|---|---|---|
| 5,475,335 A | 12/1995 | Merrill et al. |
| 6,795,295 B2 * | 9/2004 | Murakami et al. ......... 361/306.3 |

FOREIGN PATENT DOCUMENTS

| | | |
|---|---|---|
| JP | 55-91112 | 7/1980 |
| JP | 2000-514243 T | 10/2000 |
| JP | 2004-235360 | 8/2004 |
| JP | 2007-158185 A | 6/2007 |

OTHER PUBLICATIONS

PCT/JP2008/070003 International Search Report dated Jan. 28, 2009.
PCT/JP2008/070003 Written Opinion dated Jan. 28, 2009.

* cited by examiner

*Primary Examiner* — Roberts Culbert
(74) *Attorney, Agent, or Firm* — Dickstein Shapiro LLP

(57) ABSTRACT

A method for producing a thin film laminated capacitor that makes it possible to reduce the number of operations for etching its electrode layers and its dielectric layers. On a substrate, a capacitor part is formed wherein n electrode layers and (n−1) dielectric layers are alternately laminated onto each other, wherein n is 4 or more. The capacitor part is etched from the same side k times. In any $i^{th}$ etching operation, through holes are formed in an amount corresponding to respective $a_i$ layers of the electrode layers and the dielectric layers. At least one of $a_i$'s is set to 2 or more, and k is made smaller than n−1, thereby making it possible to make the $2^{nd}$ to $n^{th}$ layers of the electrode layers from the etching starting side exposed at the bottom surfaces of the through holes.

7 Claims, 9 Drawing Sheets

METHOD FOR PRODUCING A THIN FILM LAMINATED CAPACITOR

CROSS REFERENCE TO RELATED APPLICATIONS

The present application is a continuation of International Application No. PCT/JP2008/070003, filed Nov. 4, 2008, which claims priority to Japanese Patent Application No. JP2007-322945, filed Dec. 14, 2007, the entire contents of each of these applications being incorporated herein by reference in their entirety.

FIELD OF THE INVENTION

The present invention relates to a method for producing a thin film laminated capacitor.

BACKGROUND OF THE INVENTION

Regarding a multilayered thin film laminated capacitor wherein electrode layers and dielectric layers are alternately laminated onto each other, a capacitor structure 110 illustrated in a sectional view of FIG. 9 and a top view of FIG. 10 has been hitherto suggested as an example.

In this capacitor structure 110, a lower electrode layer 116 is formed on an insulating layer 114 covering a substrate 112, and dielectric layers 118b, 120b, 122b and 124b and electrode layers 118a, 120a, 122a and 124a are alternately formed on the lower electrode layer 116. The whole of the lamination is covered with an insulating layer 126. The top view of FIG. 10 illustrates a situation that the insulating layer 126 is removed. The electrode layers and the dielectric layers constitute pairs 118a and 118b; 120a and 120b; 122a and 122b; and 124a and 124b. A higher pair of the pairs is smaller so that the pairs are piled in a stepwise pattern. The entire outer circumferences of the electrode layers 116, 118a, 120a and 122a protrude outwards, along the outer circumferences, from the electrode layer and dielectric layer pair 118a and 118b, 120a and 120b, 122a and 122b, and 124a and 124b, respectively, which are above the layers 116, 118a, 120a and 122a, respectively.

Connection parts 138, 140, 142, 144 and 146 connected to the electrode layers 116, 118a, 120a, 122a and 124a, respectively are exposed on the individual steps of the insulating layer 126. The respective connection parts 138, 140, 142, 144 and 146 are electrically connected to each other in an appropriate manner in accordance with a desired capacity characteristic (see, for example, Patent Document 1).

Patent Document: JP-T-2000-514243

When the stepwise capacitor structure 110 is formed, all layers that are to be the electrode layers and the dielectric layers are laminated and next the layers are etched step by step from the above to form the electrode layers and the dielectric layers in each step into desired forms. Thereafter, an insulating layer is formed thereon.

In a case where the number of the electrodes is N, at least (N−1) steps are required in order to make the upper surfaces of the electrode layers in each step exposed even when the electrode layer and the dielectric layer which correspond to a step are etched together. In order to conduct an etching operation, the following steps are generally experienced: the formation of a resist→exposure→development→etching→the removal of the resist. Moreover, a photomask becomes necessary for each of the layers. When the number of laminated layers is increased in order to increase the capacitance of the capacitor, steps therefor are added so that costs for the production increases remarkably.

Furthermore, the areas of the electrodes which constitute the capacitor by sandwiching a dielectric layer become smaller one layer by one layer as the positions of the electrodes are higher. Thus, even when the number of the laminated layers is increased, the capacitance is not varied very much.

SUMMARY OF THE INVENTION

In light of this situation, the present invention provides a method for producing a thin film laminated capacitor that makes it possible to decrease the number of operations for etching its electrode layers and its dielectric layers.

In order to solve the above-mentioned problems, the present invention provides a method, for producing a thin film laminated capacitor, described as follows:

A method for producing a thin film laminated capacitor of the present invention includes a first step of forming a capacitor part in which n electrode layers wherein n is a natural number of 4 or more, and (n−1) dielectric layers are alternately laminated onto each other, a second step of etching the capacitor part, from one side of the lamination direction of the capacitor part, totally k times wherein k is a natural number of two or more; making through holes in said electrode layers and said dielectric layers in an amount corresponding to respective $a_i$ layers in any $i^{th}$ etching operation wherein i=1, 2, ... k, and setting at least one of $a_i$'s wherein i=1, 2, ... k to a natural number of two or more and making k≦n−1; whereby each of the second and the higher-order electrode layers from said one side of the lamination direction of said capacitor part are exposed, and a third step of electrically connecting each exposed second and higher-order electrode layer to external electrodes through one or more of said through holes.

In the first step, the capacitor part may be formed by laminating the electrode layers and the dielectric layers alternately and successively onto each other on the substrate, or by jointing separately-formed parts to each other, for example, by jointing, to a first part wherein (n−r) layers of the electrode layers and (n−r−1) layers of the dielectric layers are laminated, a second part wherein r layers of the electrode layers and r layers of the dielectric layers are laminated.

In the second step, plural electrode layers and the dielectric layers are penetrated by at least a etching operations. The etching may be conducted from either side of the lamination direction. In other words, the etching may be conducted from a side opposite to the substrate of the capacitor part, i.e., from the topmost electrode layer side farther from the substrate, or may be conducted from the substrate side by forming through holes in the substrate. When the etching is conducted from the same side (one side of the lamination direction) to remove N layers of the electrode layers and N layers of the dielectric layers from the etching starting side (one side of the lamination direction), wherein N's are natural numbers, so as to form through hole(s), the $(N+1)^{th}$ electrode layer from the etching starting side are exposed at the bottom surface of the through hole(s).

According to the above-described method, through holes are formed in the electrode layers and the dielectric layers by at least an etching operation, and then connecting them to each other. In this way, the number of the etching operations can be reduced.

According to the above-mentioned method, it is unnecessary to laminate the electrode layers and the dielectric layers in a stepwise pattern; thus, the layers can be laminated onto each other to have the same area, so as to make the areas of the electrode layers as large as possible. In this way, a fall in the capacitance between the electrode layers on the basis of a decrease in the areas of the electrode layers can be made as small as possible.

Specifically, the method can be made into various embodiments as follows:

In a first embodiment, a selection is made in such a manner that all natural numbers from 1 to (n−1) can each be represented by one element $a_p$ wherein p is a natural number of k or less selected from a group X of the elements $a_i$'s, X{$a_1$, $a_2 \ldots a_k$}, or by a summation of two or more elements $a_q$'s, $\Sigma a_q = m$ wherein m is a natural number, wherein each q is a natural number of k or less, and further k becomes a minimum value. In the second step, the $(a_p+1)^{th}$ electrode layer from said one side of the lamination direction is exposed at the bottom surface(s) of the through hole(s) formed by the $p^{th}$ etching operation corresponding to an element $a_p$; the through holes formed by the $q^{th}$ etching operations, respectively, which correspond to the two or more elements $a_q$'s making the summation $\Sigma a_q$ equal to m, are at least partially connected to each other; and the $(m+1)^{th}$ electrode layer from said one side of the lamination direction is exposed at the bottom surfaces of the through holes connected to each other; whereby the second and higher-order electrode layers from said one side of the lamination direction are each exposed. The through hole(s) formed by the $p^{th}$ etching operation may include through holes connected to one or more of the other through holes. The through holes formed by the $q^{th}$ etching operations may include one or more through holes not connected to any other through hole. Furthermore, three or more of the through holes may be connected to each other.

According to the method, about the electrode layers, the $2^{nd}$ to the $n^{th}$ layers thereof from one side of the lamination direction of the capacitor part are each exposed at the bottom surface of the through holes. Since k is the minimum value, the number of the etching operations can be made the smallest.

In a second embodiment, $a_1, a_2, \ldots, a_k$ are selected so as to make it possible to represent each of all natural numbers from 1 to (n−1) by one or two elements $a_j$'s selected from the group X of the elements $a_i$'s, X{$a_1, a_2, \ldots, a_k$}.

In this case, the number of the etching operations to be combined with each other is made as small as possible to prevent the through holes from becoming large, thereby making it possible to prevent a fall in the capacitance between the electrode layers on the basis of a decrease in the areas of the electrode layers as much as possible.

In each of the constitutions, preferably, in said second step, the layer number of said electrode layers and said dielectric layers in which the through holes are formed in the second and higher-order etching operations is equal to or more than the layer number of the electrode layers and the dielectric layers in which one or more of the through holes are formed by each of the etching operations before the above-mentioned etching operation. In other words, the following is satisfied: $a_1 \leq a_2 \leq \ldots a_{n-1} \leq a_n$.

When the workpiece is viewed from the lamination direction, allowable is a case where inside the through holes formed by earlier etching operations, through holes are formed by one or more later ones of the etching operations. In this case, the area where the electrode and dielectric layers are removed by the earlier etching operations become larger than the area where the electrode and dielectric layers are removed by the earlier etching operations. By making the number of the layers to be removed smaller in the earlier etching operations, which makes the area to be removed larger, the total area of the electrode and dielectric layers to be removed by the formation of the through holes is made as small as possible, thereby making it possible to suppress a fall in the capacitance between the electrode layers on the basis of the formation of the through holes as much as possible.

Preferably, in each of the etching operations in the second step, the same etching liquid is used for both of the electrode layers and the dielectric layers to form one or more of the through holes continuously.

In this case, in each of the etching operations, through holes may be formed by use of the same device for both of the electrode layers and the dielectric layers. Thus, the process becomes simple. In other words, in the case of using different etching liquids for the electrode layers and the dielectric layers, different devices are used to form through holes in the electrode layers and the dielectric layers, respectively, and some other operation is required, so that the process becomes complicated; on the other hand, when the same etching liquid is used, the process becomes simple.

Preferably, the thicknesses of the electrode layers other than the electrode layer farthest from said one side of the lamination direction, that is, the etching starting side are equal to each other, and the thicknesses of the dielectric layers are equal to each other.

In this case, the rates of etching the layers become equal to each other, and in each of the etching operations, precise etching can be attained in an amount corresponding to a desired number of layers out of the layers.

According to the present invention, the number of operations for etching electrode layers and dielectric layers can be decreased. Even when the number of the layers laminated onto each other becomes large, it is unnecessary to increase the number of the etching operations in proportion to the number of the laminated layers; thus, production costs can be suppressed.

DESCRIPTION OF REFERENCE SYMBOLS

Figure 1A:
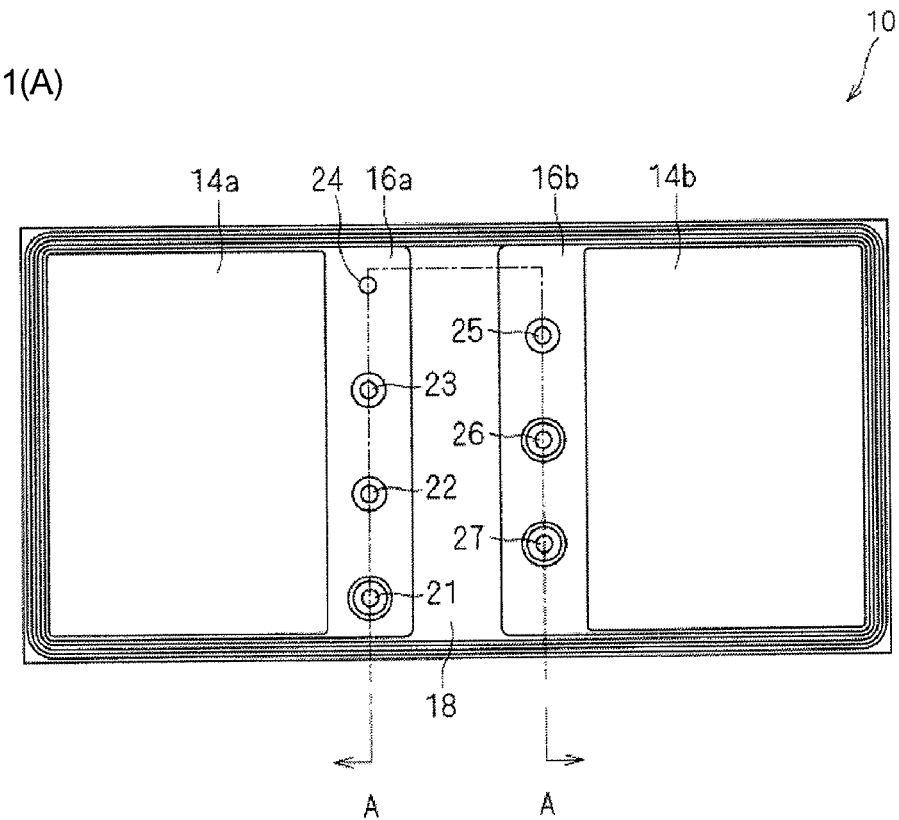
FIG. 1(A) is a plan view of a thin film laminated capacitor.

10 thin film laminated capacitor
12 substrate
13 adhesive layer
14*a* and 14*b* external electrodes 16a and 16b leading-out electrodes
18 capacitor part
21-27 connecting conductors
30-37 electrode layers
40-46 dielectric layers
50 insulating layer
60 insulating layer
70 metal film

DETAILED DESCRIPTION OF THE INVENTION

With reference to FIGS. 1(A) to 8(F), embodiments of the present invention will be described hereinafter.

Figure 1B:
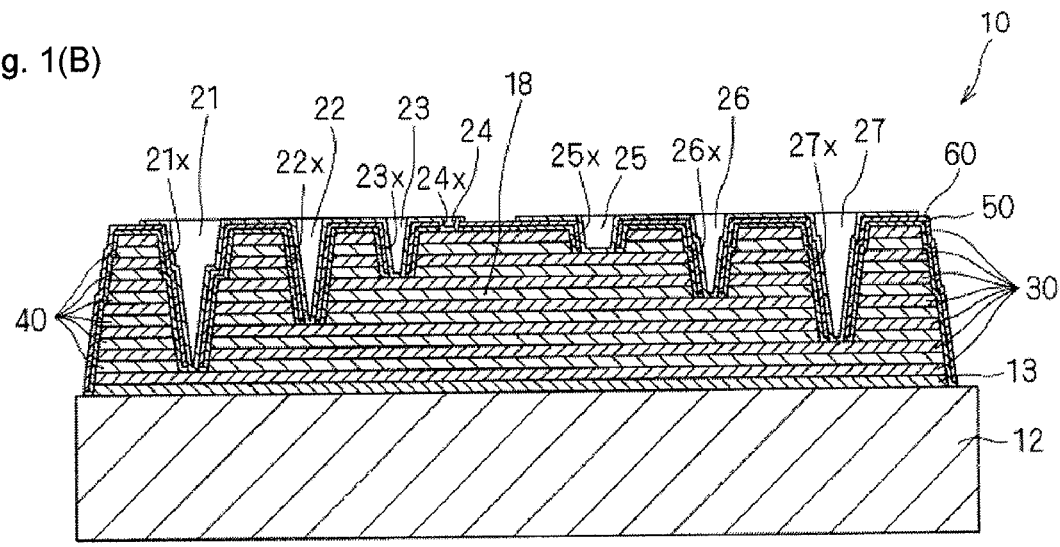
FIG. 1(B) is a sectional view thereof along line A-A of FIG. 1(A)(working example).

First, the structure of a thin film laminated capacitor 10 according to a working example of the present invention is described with reference to FIGS. 1(A) and 1(B). FIG. 1(A) is a plan view of the thin film laminated capacitor 10, wherein the capacitor is viewed from the above. FIG. 1(B) is a sectional view wherein the capacitor is cut along line A-A in FIG. 1(A).

As illustrated in FIGS. 1(A) and 1(B), in the thin film laminated capacitor 10, an adhesive layer 13 is formed on a substrate 12, and on the adhesive layer 13, seven electrode layers 30 and six dielectric layers 40 are alternately laminated onto each other to form a capacitor part 18. In the capacitor part 18, six sets of capacitor elements, in each of the dielectric layers 40 is sandwiched between two of the electrode layers 30, are formed. The whole of the capacitor 18 is covered with insulating layers 50 and 60, and external electrodes 14a and 14b are formed on the upper surface thereof. In the insulating layers 50 and 60, and the electrode layers 30 and the dielectric layers 40, through holes 21x to 27x are each formed to reach, from the upper surface side, either one of the electrode layers 30. In the through holes 21x to 27x, connecting conductors 21 to 27 are formed which are each connected to one of the electrode layers 30. As illustrated in FIG. 1(A), the connecting conductors 21 to 27 are electrically connected to the external electrodes 14a and 14b through leading-out electrodes 16a and 16b so that the capacitor elements are connected to each other in a predetermined manner. The material of the adhesive layer 13 may be equivalent in composition base to that of the dielectric layer 40, and may be equivalent to that of the dielectric layer 40.

Secondly, the method for producing a thin film laminated capacitor is described with reference to FIGS. 2(A) to 8(F). FIGS. 2(A) to 6(N) are each a sectional view illustrating a step of producing the thin film laminated capacitor. FIGS. 7(A) to 8(F) are each a plan view illustrating a step of producing the thin film laminated capacitor. FIG. 2(A) to FIG. 6(M) each correspond to a cross section obtained by making a cut along line A-A in FIG. 1(A). FIG. 6(N) corresponds to a cross section obtained by making a cut along line B-B in FIG. 8(E).

Figure 2A:
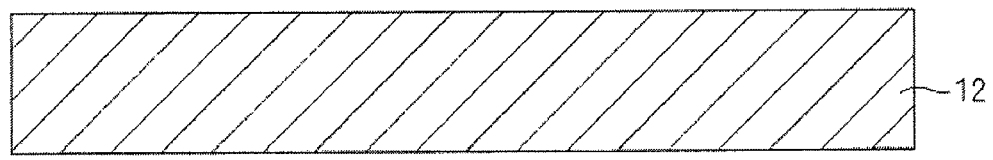
FIGS. 2(A) to 2(C) are each a sectional view illustrating a step of producing a thin film laminated capacitor (working example).
Figure 2B:
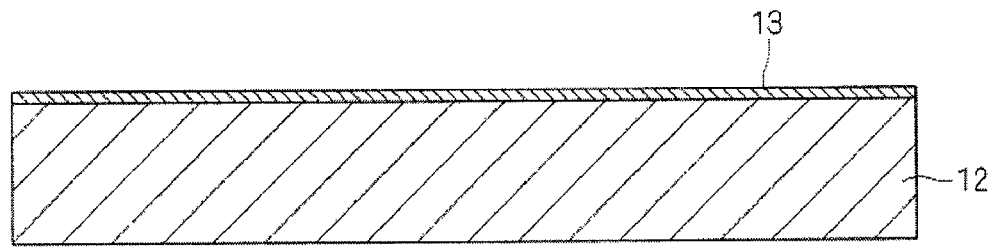
Figure 2C:
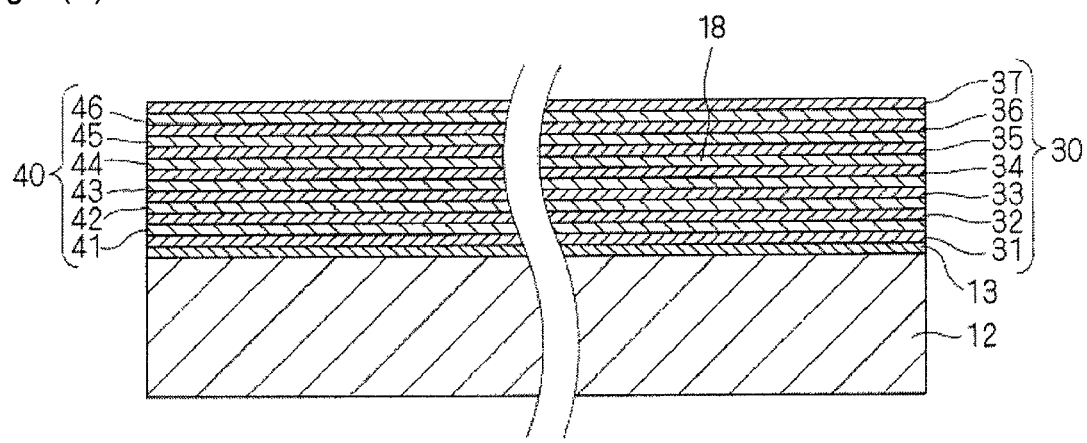

As illustrated in FIG. 2(A), a substrate 12 is prepared. Next, as illustrated in FIG. 2(B), an adhesive layer 13 is formed on the substrate 12. Next, as illustrated in FIG. 2(C), n electrode layers 30 wherein n is a natural number, and (n−1) dielectric layers 40 are alternately laminated onto each other to form a capacitor part 18. For example, seven electrode layers 31 to 37 and six dielectric layers 41 to 46 are laminated alternately one by one onto each other.

Figure 3D:
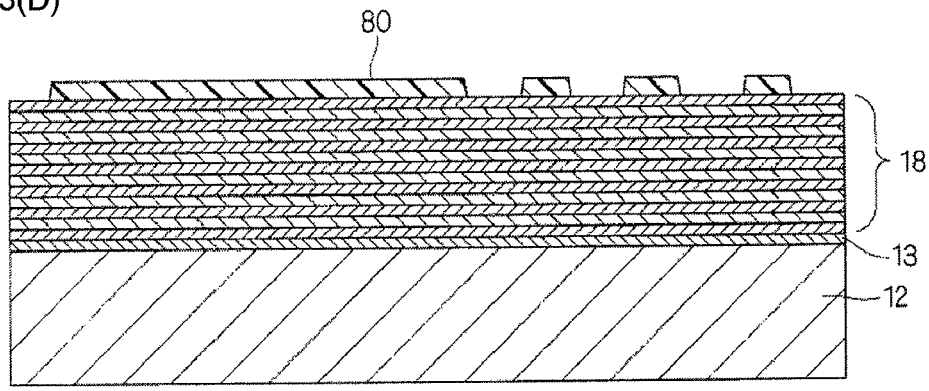
FIGS. 3(D) to 3(F) are each a sectional view illustrating a step of producing a thin film laminated capacitor (working example).
Figure 3E:
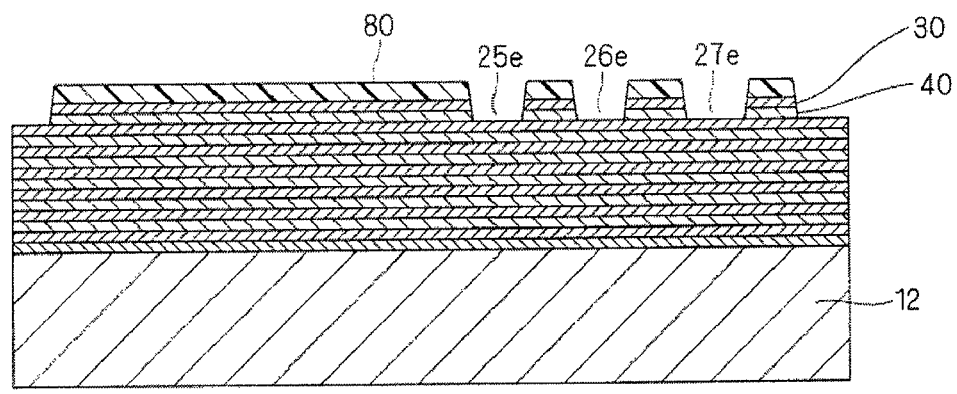
Figure 3F:
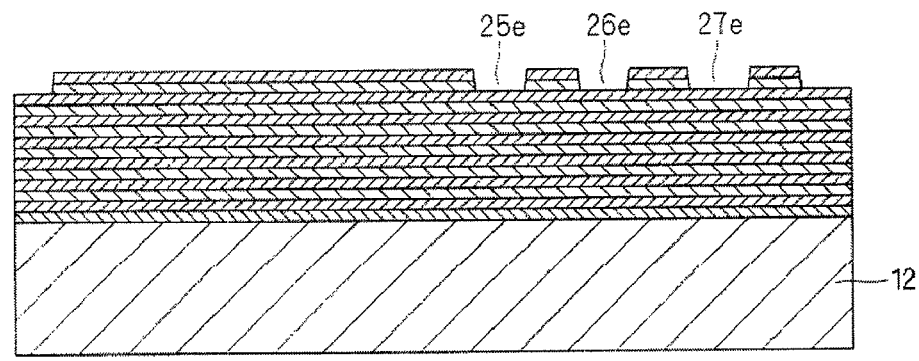
Figure 7A:
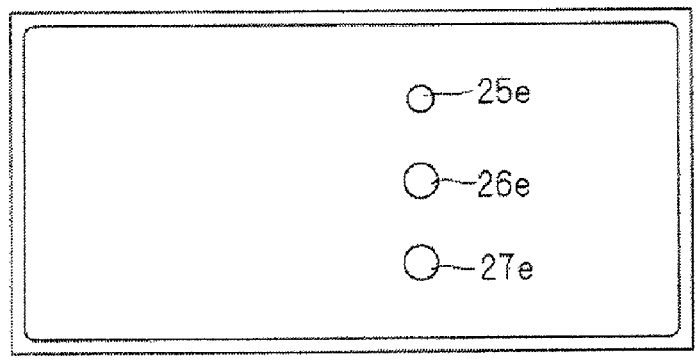
FIGS. 7(A) to 7(C) are each a plan view illustrating a step of producing the thin film laminated capacitor (working example).

Next, as illustrated in FIG. 3(D), a resist pattern 80 wherein through holes are formed in predetermined parts is formed on the capacitor part 18. Next, as illustrated in FIG. 3(E), the electrode layers 30 and the dielectric layers 40 are subjected to etching processing, so as to be etched in an amount corresponding to one of the layers 30 and one of the layers 40 through the resist pattern 80 by RIE (reactive ion etching), ion milling or some other method, thereby removing predetermined parts of the electrode layer 30 and the dielectric layer 40 to form through holes 25e, 26e and 27e. Next, as illustrated in FIGS. 3(F) and 7(A), the remaining resist pattern 80 is removed.

Figure 4G:
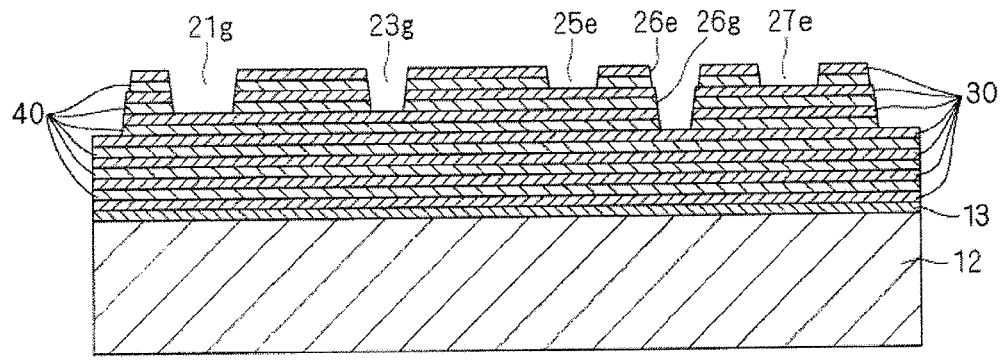
FIGS. 4(G) to 4(I) are each a sectional view illustrating a step of producing the thin film laminated capacitor (working example).
Figure 5J:
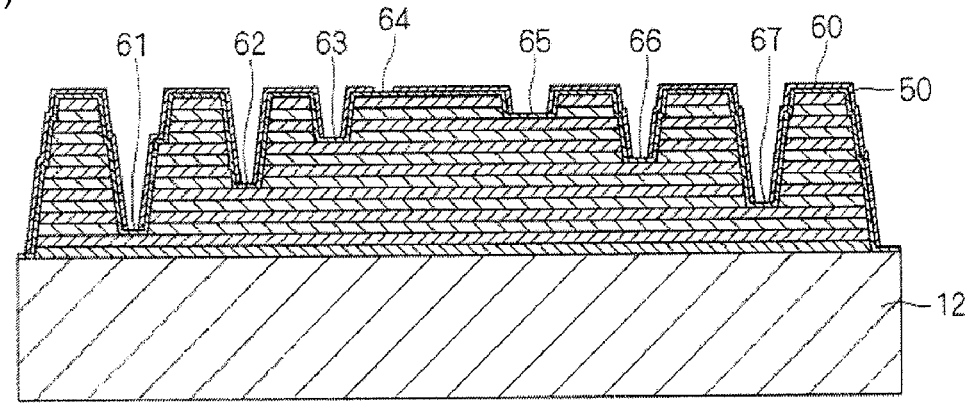
FIGS. 5(J) to 5(L) are each a sectional view illustrating a step of producing the thin film laminated capacitor (working example).
Figure 5K:
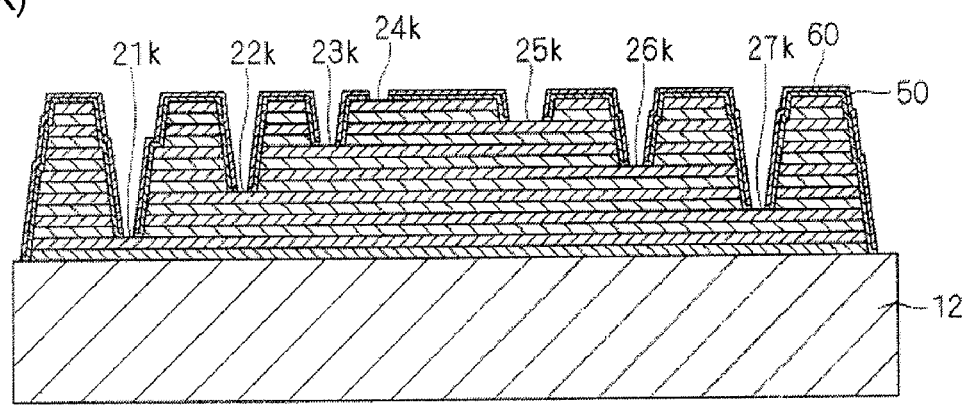
Figure 7B:
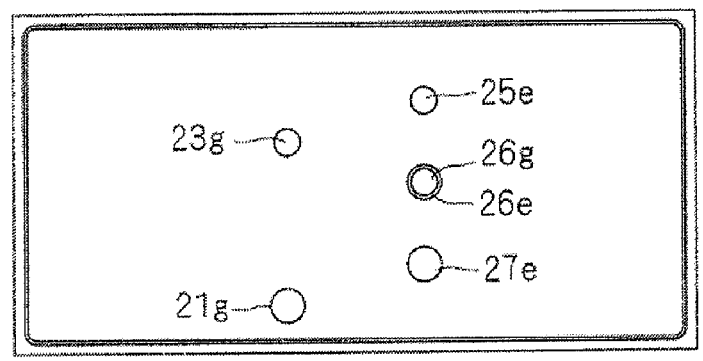

Next, as illustrated in FIG. 4(G) and FIG. 7(B), in the same way as in the first etching operation illustrated in FIG. 3(E), a resist pattern is used to conduct a second etching operation. However, the operation is different from the first etching operation in the numbers of respective layers to be removed of the electrode layers 30 and the dielectric layers 40. In the second etching operation, the electrode layers 30 and the dielectric layers 40 are subjected to etching processing, so as to be etched in an amount corresponding to two of the layers 30 and two of the layers 40, thereby removing predetermined parts of the electrodes 30 and the dielectric layers 40 to form through holes 21g, 23g and 26g. The remaining resist pattern is removed.

Figure 4H:
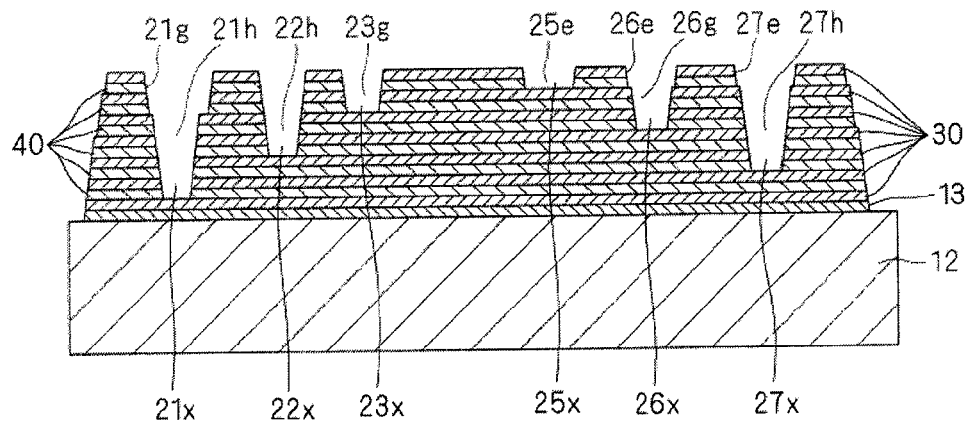
Figure 7C:
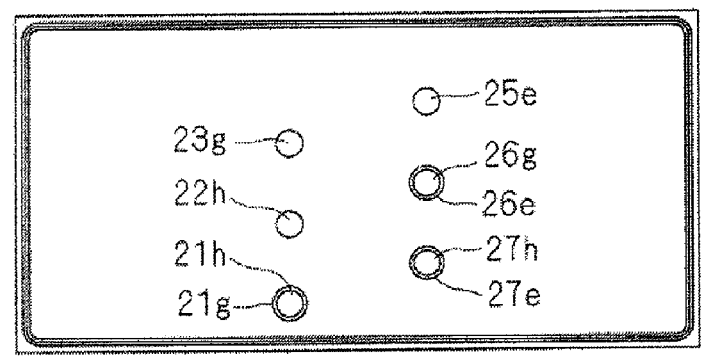

Next, as illustrated in FIG. 4(H) and FIG. 7(C), in the same way in the first and second etching operations, a third etching operation is conducted. However, in the third etching operation, the electrode layers 30 and the dielectric layers 40 are subjected to etching processing, so as to be etched in an amount corresponding to four of the layers 30 and four of the layers 40, thereby removing predetermined parts of the electrode layers 30 and the dielectric layers 40 to form through holes 21h, 22h and 27h. The remaining resist pattern is removed.

According to the etching operations of its total number is three, through holes 21x to 23x and 25x to 27x are formed in the electrode layers 30 and the dielectric layers 40, each formed of a through hole or continuous two or more of the through holes. Either one of the $2^{nd}$ to $7^{th}$ electrode layers 30 from the etching starting side is exposed at the bottom surfaces of the through holes 21x to 23x, and 25x to 27x.

Figure 4I:
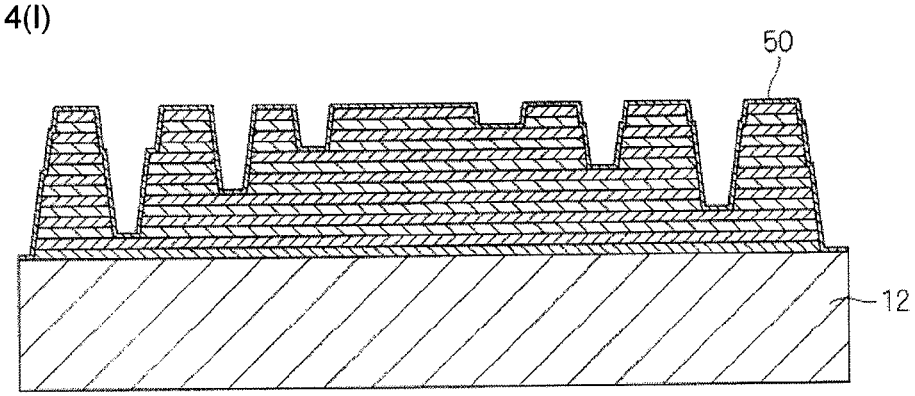
Figure 8D:
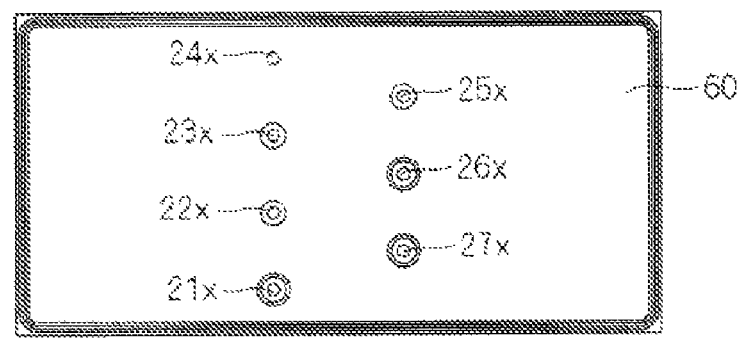
FIGS. 8(D) to 8(F) are each a plan view illustrating a step of producing the thin film laminated capacitor (working example).

Next, as illustrated in FIG. 4(I), a first insulating layer 50 is formed onto the whole from the upper surface side to cover the inner circumferential surfaces and the bottom surfaces of the through holes. Next, as illustrated in FIG. 5(J) and FIG. 8(D), a second insulating layer 60 is formed on the first insulating layer 50, and then openings 61 to 67 are formed to make the first insulating layer 50 exposed in the openings 61 to 67. Next, as illustrated in FIG. 5(K), the second insulating layer 60 is used as a mask to remove parts of the first insulating layer 50 which are exposed in the openings 61 to 67 in the second insulating layer 60, thereby making either one of the $1^{st}$ to $7^{th}$ electrode layers exposed at the bottom surfaces 21k to 27k.

Figure 5L:
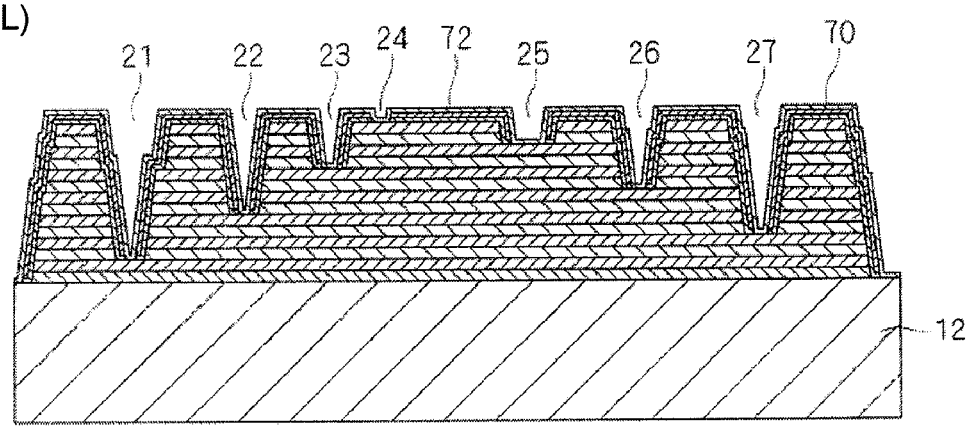
Figure 6M:
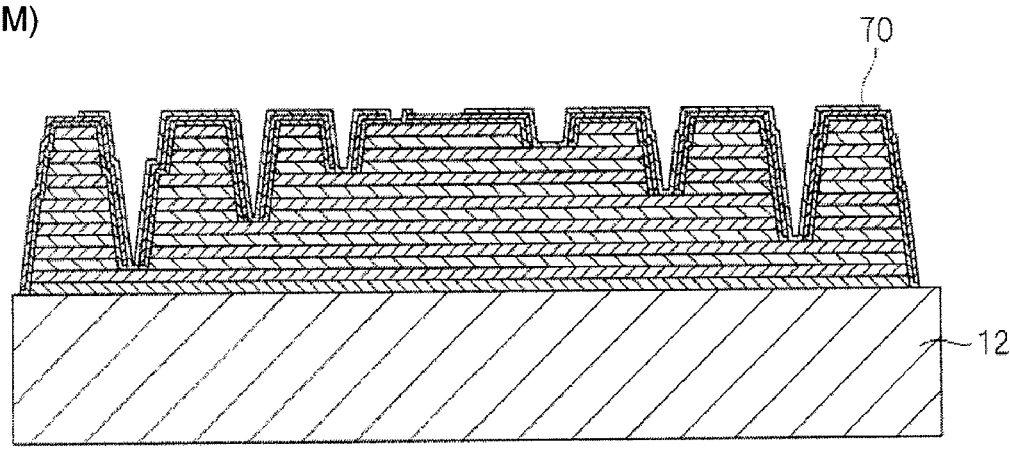
FIGS. 6(M) and 6(N) are each a sectional view illustrating a step of producing the thin film laminated capacitor (working example).
Figure 6N:
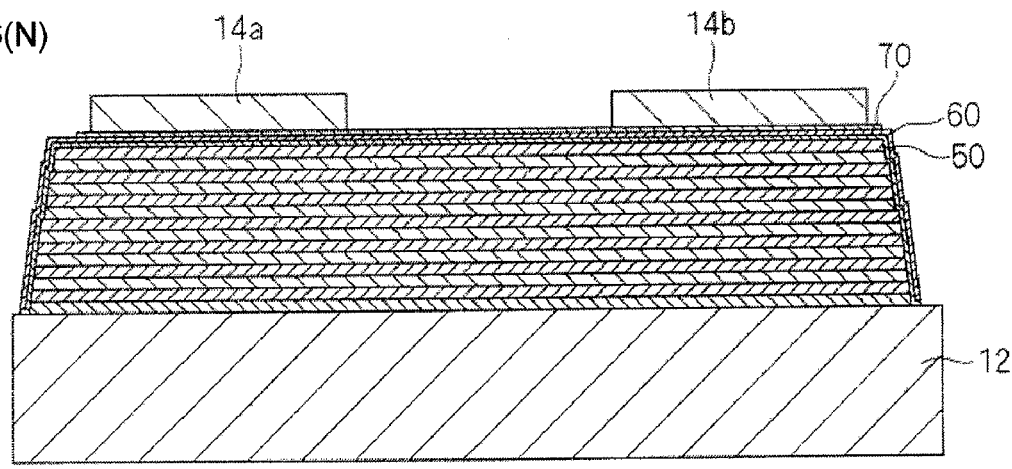
Figure 8E:
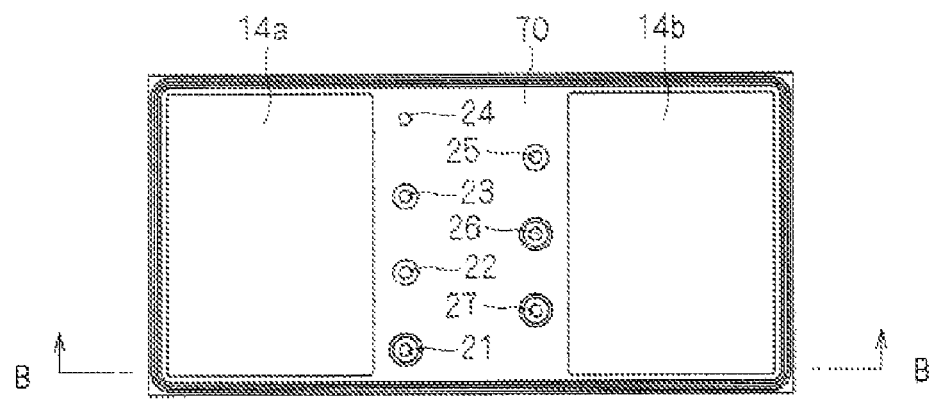
Figure 8F:
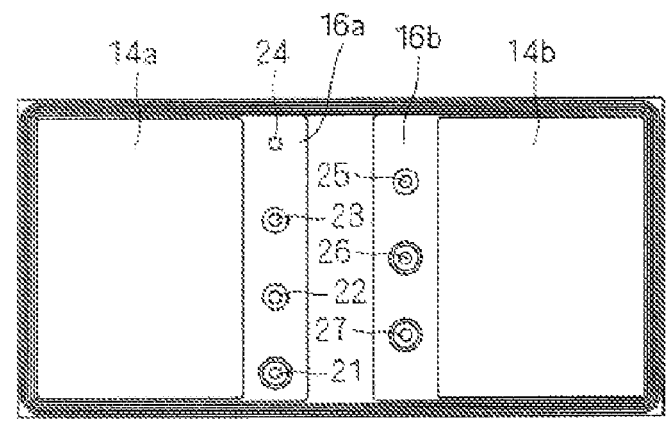
Figure 9:
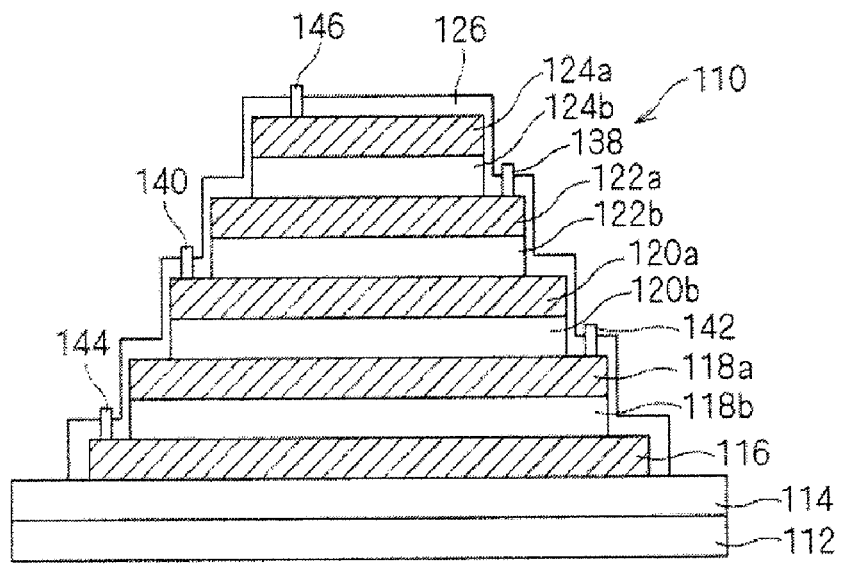
FIG. 9 is a sectional view of a thin film laminated capacitor (conventional example).
Figure 10:
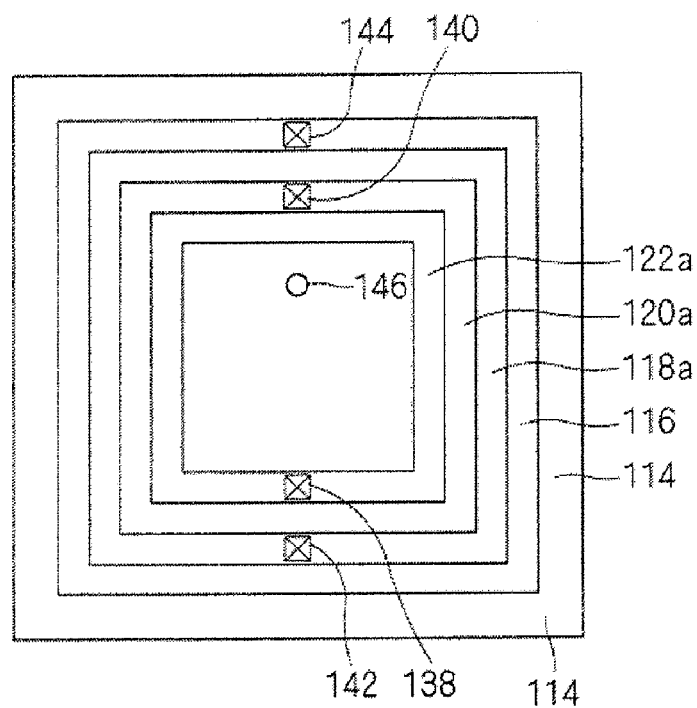
FIG. 10 is a plan view of the thin film laminated capacitor (conventional example).

Next, as illustrated in FIG. 5(L), a metal film 70 is formed to cover the whole of the upper surface side. In this way, connecting connectors 21 to 27 are formed on the inner circumferential surfaces and the bottom surfaces of the through holes 21x to 27x, respectively. Next, as illustrated in FIG. 6(N) and FIG. 8(E), external electrodes 14a and 14b are formed. Next, as illustrated in FIG. 6(M) and FIG. 8(F), the metal film 70 is patterned to form leading-out electrodes 16a and 16b.

Next, a protecting layer is formed thereon as necessary, which is not illustrated. When plural capacitors are produced together with each other in the form of an assembly substrate, the capacitors are divided into pieces by dicing or the like.

Next, a specific example of the production is described.

Prepared was a Si substrate, 525 μm in thickness, having a surface on which a thermally oxidized film was formed. A raw material solution wherein Br, Sr and Ti (Ba:Sr:Ti=7:3:10 (ratio by mole)) were mixed with an organic compound was applied on the thermal oxidized film of the Si substrate by spin coating, and the workpiece was dried. Thereafter, the workpiece was subjected to RTA (rapid thermal annealing) in the atmosphere of oxygen at 650° C. for 30 minutes to form a barium strontium titanate ((Ba, Sr)TiO$_2$, which will be abbreviated to BST hereinafter) thin film of 100 nm thickness. Next, a Pt film of 200 nm thickness was formed thereon by sputtering. The formation of a Pt film and a BST thin film was repeated to produce a laminate wherein the BST thin films the number of which was 7, and the Pt films the number of which was 7 were laminated onto each other. The firstly formed BST thin film was to be an adhesive layer 13, and the other BST thin films were to be dielectric layers 40. The Pt films were to be electrode layers 30.

A photosensitive resist was applied onto the upper surfaces of the laminate, and the workpiece was baked, exposed, developed, and then subjected to annealing treatment at a predetermined temperature to form a resist pattern 80. The resist pattern 80 was used as a mask to subject the electrode layers 30 and the dielectric layers 40 to etching processing by RIE (reactive ion etching), so as to be etched in an amount corresponding to one of the layers 30 and one of the layers 40, thereby removing predetermined parts to form through holes 25e, 26e and 27e. The remaining resist was subjected to ashing treatment with O$_2$ plasma, so as to be removed.

Next, a second etching operation was conducted in the same way. In the second etching operation, the period when the etching was conducted was changed from that in the first etching operation, and the electrode layers 30 and the dielectric layers 40 were subjected to etching processing so as to be etched in an amount corresponding to two of the layers 30 and two of the layers 40. In this way, predetermined parts were removed to form through holes 21g, 23g, and 26g, and then the resist was removed.

Next, a third etching operation was conducted. The period when the etching was conducted was changed from the respective periods in the first and second etching operations, and the electrode layers 30 and the dielectric layers 40 were subjected to etching processing so as to be etched in an amount corresponding to four of the layers 30 and four of the layers 40. In this way, predetermined parts were removed to form through holes 21h, 22h, and 27h, and then the resist was removed.

Next, the workpiece was subjected to annealing treatment in the atmosphere of oxygen at 850° C. for 30 minutes in order to improve the dielectric constant of the BST dielectric layers.

Next, SiNx was formed into a first insulating layer 50 of 500 nm thickness on the whole of the upper surfaces of the laminate by sputtering. SiNx includes, besides Si$_3$N$_4$, which has a stoichiometric composition wherein the ratio by mole of silicon to nitrogen is 3:4, compounds each having a ratio of silicon to nitrogen that is different from the ratio according to the stoichiometric composition.

Next, a photosensitive polyimide was applied into a second insulating layer 60 thereon, and the workpiece was exposed, developed and cured to form a pattern. Thereafter, the polyimide was used as a mask to work the SiNx layer by RIE, so as to expose the electrode layers 30 at the bottom surfaces of the through holes 21x to 27x.

Next, an adhesive layer of Ti, 50 nm in thickness, was formed thereon by sputtering, and then Cu was formed into a film of 200 nm thickness thereon, thereby forming a metal film 70.

Next, a photosensitive resist was applied thereon, and the workpiece was baked, exposed, developed, and then subjected to annealing treatment at a predetermined temperature to form a resist pattern. Cu was formed into a film of 3000 nm thickness in the openings in the resist by electroplating, so as to form external electrodes 14a and 14b, and then the resist pattern was removed. Although only Cu was formed into the film in the case, the species of the metal can be changed in accordance with a method for packaging the thin film laminated capacitor, or some other. For example, Au/Cu, Au/Ni or Sn/Cu may be selected.

Next, a photosensitive resist was applied thereon, and the workpiece was baked, exposed, developed, and then subjected to annealing treatment at a predetermined temperature to form a resist pattern. This resist pattern was used as a mask to wet-etch the metal film 70 to pattern the film into leading-out electrodes 16a and 16b.

As described above, the through holes 21x to 27x are formed by combinations of the 1$^{st}$ to 3$^{rd}$ (No. 1 to No. 3) etching operations as shown in Table 1 described below.

TABLE 1

| Etching operation | | The number of layers for through holes ($a_j$) | | | | | |
|---|---|---|---|---|---|---|---|
| No. (i) | The number ($a_i$) of layers | 1 | 2 | 3 | 4 | 5 | 6 |
| 1 | 1 | ○ | | ○ | | ○ | |
| 2 | 2 | | ○ | ○ | | | ○ |
| 3 | 4 | | | | ○ | ○ | ○ |

The numbers of the electrode layers 30 through which the through holes 21x to 23x and 25x to 27x penetrate, respectively, i.e., 1 to 6, as well as the numbers of the dielectric layers 40 through which the same holes penetrate, respectively, i.e., 1 to 6, can each be realized by combining the numbers of the electrode layers 30 wherein the through holes are formed in the respective etching operations, i.e., 1, 2 and 4 as shown by one or more of ○'s, as well as by combining the numbers of the dielectric layers 40 wherein the through holes are formed in the respective etching operations, i.e., 1, 2 and 4, as shown by one or more of ○'s.

For example, the through hole 25x, which penetrates in an amount corresponding to one of the electrode layers and one of the dielectric layers, is formed by the first etching operation for forming the through hole 25e in one of the electrode layers and one of the dielectric layers. The through hole 23x, which penetrates in an amount corresponding to two of the electrode layers and two of the dielectric layers, is formed by the second etching operation for forming the through hole 23g in two of the electrode layers and two of the dielectric layers. The through hole 26x, which penetrates in an amount corresponding to three of the electrode layers and three of the dielectric layers, is formed by a combination of the first etching operation for forming the through hole 26e in one of the electrode layers and one of the dielectric layers with the second etching operation for forming the through hole 26g in an amount corresponding to two of the electrode layers and two of the dielectric layers. The through hole 22x, which penetrates in an amount corresponding to four of the electrode layers and four of the dielectric layers, is formed by the third etching operation for forming the through hole 22h in an amount corresponding to four of the electrode layers and four of the dielectric layers. The through hole 27x, which penetrates in an amount corresponding to five of the electrode layers and five of the dielectric layers, is formed by a combination of the first etching operation for forming the through hole 27e in one of the electrode layers and one of the dielectric layers with the third etching operation for forming the through hole 27h in an amount corresponding to four of the electrode layers and four of the dielectric layers. The through hole 21x, which penetrates in an amount corresponding to six of the electrode layers and six of the dielectric layers, is formed by a combination of the second etching operation for forming the through hole 21g in two of the electrode layers and two of the dielectric layers with the third etching operation for forming the through hole 21h in an amount corresponding to four of the electrode layers and four of the dielectric layers.

As is understood from Table 1, all natural numbers from 1 to 6 can each be represented by a value of one element selected from the group X {1, 2, 4} or a summation of values of two or more elements selected therefrom. In the group X {1, 2, 4}, the elements are arranged from the smallest of the elements toward larger values.

About a capacitor part wherein electrode layers the number of which is n and dielectric layers the number of which is (n−1) are alternately laminated onto each other, the following is true for (n−1) through hole species that penetrate, through the electrode layers and the dielectric layers, in respective amounts which correspond to form respective single layers of the electrode layers and the dielectric layers to respective (n−1) layers thereof: as shown in, for example, Table 2 described below, the through holes different from each other in the number of layers which the through holes penetrate through can each be formed in one of the etching operations by combining the "number of layers for through holes" with the number ($a_i$), which is the number of the electrode layers and the dielectric layers wherein through holes are formed by any $i^{th}$ etching operation, as represented by each of ○'s. In this case, it is necessary to conduct etching totally (n−1) times.

TABLE 2

| Etching operation No. (i) | The number ($a_i$) of layers | The number of layers for through holes ($a_i$) | | | | | |
|---|---|---|---|---|---|---|---|
| | | 1 | 2 | 3 | 4 | 5 | 6 |
| 1 | 1 | ○ | | | | | |
| 2 | 2 | | ○ | | | | |
| 3 | 3 | | | ○ | | | |
| 4 | 4 | | | | ○ | | |
| 5 | 5 | | | | | ○ | |
| 6 | 6 | | | | | | ○ |

When through holes which penetrate through plural ones of the electrode layers and plural ones of the dielectric layers are formed by at least an etching operation, (n−1) through hole species can be formed by the one etching operation and other etching operations the total number of which is smaller than (n−1).

For this purpose, in the case of conducting etching totally k times and forming through holes in the electrode layers and the dielectric layers in an amount corresponding to respective $a_i$ layers of the electrode layers and the dielectric layers in any $i^{th}$ etching operation, it is advisable to decide a group X in such a manner that at least one $a_i$ of the elements $a_i$'s wherein i=1, 2, . . . k is set to two or more, and further all natural numbers from 1 to (n−1) can each be represented by one element $a_p$ selected from the group X {$a_1$, $a_2$, . . . $a_k$}, or a summation $\Sigma a_q$ of two or more elements $a_q$'s selected therefrom.

About the group X, plural group X species may be selected. When the number of the etching operations is increased, the number of mask pattern species increases and the number of repeated steps increases. Thus, in order to produce the capacitor of the present invention effectively, it is preferred that "the total number k of the etching operations is a minimum value".

More generally, the minimum value $k_{min}$ of the total number k of the etching operations is a minimum value of k's satisfying $n \leq 2^k - 1$.

It is allowable to combine the through holes formed by two or more of the etching operations appropriately with each other to connect the combined through holes to each other. When the workpiece in this case is viewed from the lamination direction, the through holes according to one or more later ones of the etching operations are formed inside the through holes formed by earlier etching operations. This is based on the following: when the through holes are formed, it is necessary to carry out patterning steps through masks; when the workpiece is repeatedly etched to connect some of the through holes to each other, considering positional shifts of the masks, it is necessary to arrange through hole parts of the mask for the later etching operation(s) inside through hole parts of the mask for the early etching operation. Accordingly, the sectional area of the through holes formed by the earlier etching operation is larger than that of the through holes formed by the later etching operation(s). As the respective numbers of the electrode layers and the dielectric layers wherein the through holes according to the early etching operation are formed are smaller, the total area where the electrode layers are removed by the etching operations is smaller so that a fall in the capacitance between the electrode layers on the basis of the removal of the electrode layers can be made small. For this purpose, it is preferred to satisfy the following: $a_1 \leq a_2 \leq \ldots a_{k-1} \leq a_k$.

When the workpiece is viewed from the lamination direction, allowable is a case where inside the through holes formed by earlier etching operations, through holes are formed by one or more later ones of the etching operations. In this case, it is necessary to make the through holes formed by the early etching operation larger when the number of the etching operations to be combined with each other is made larger. As the number of the etching operations to be combined with each other is smaller, the total of the electrode areas removed by the combined etching operations is smaller. Thus, a fall in the capacitance between the electrode layers on the basis of the removal of the electrode layers can be made small. In order to restrain the fall in the capacitance based on the electrode removal into the minimum level, it is advisable to set the number of the etching operations that can be combined with each other for forming the through holes connected to each other to a minimum number. The "number of the etching operations that are combined with each other" is set to, for example, two or more.

When n is, for example, 4, a preferred example of the group X{$a_1$, $a_2$, . . . $a_k$} about which these matters are considered is a group X{1, 2}, k of which is 2. When n is 5, a preferred example of the group X is a group X{1, 2, 2}, k of which is 3. When n is 6, a preferred example of the group X is a group X{1, 2, 3}, k of which is 3. When n is 7, a preferred example of the group X is a group X{1, 2, 4}, k of which is 3. In these examples, "the total number k of the etching operations is a minimum value", and it is also possible that "the number of the etching operations to be combined with each other is set to 2 or less". It is also possible to satisfy the following: $a_1 \leq a_2 \leq \ldots a_{k-1} \leq a_k$.

The case where n is 8 and "the total number k of the etching operations is a minimum value" is a case where the group X is X{1, 2, 4}, k of which is 3. In this case, it is impossible that "the number of the etching operations to be combined with each other is set to 2 or less". As shown in, for example, Table 3 described below, the "number of layers for through holes" is combined with the number of layers ($a_i$), which is the number of the electrode layers and the dielectric layers wherein through holes are formed by any $i^{th}$ etching operation, as represented by one or more of ○'s.

TABLE 3

| Etching operation | The number of layers for through holes ($a_i$) | | | | | | |
|---|---|---|---|---|---|---|---|
| No. (i) | The number ($a_i$) of layers | 1 | 2 | 3 | 4 | 5 | 6 | 7 |
| 1 | 1 | ○ | | ○ | | ○ | | ○ |
| 2 | 2 | | ○ | ○ | | | ○ | ○ |
| 3 | 4 | | | | ○ | ○ | ○ | ○ |

When n is 8 and it is not required that "the total number k of the etching operations is a minimum value", a group making it possible that "the number of the etching operations to be combined with each other is set to 2 or less" can be selected. For example, the group X is a group X{1, 2, 3, 4}, k of which is 4, and as shown in Table 4 described below, the "number of layers for through holes" is combined with the number of layers ($a_i$), which is the number of the electrode layers and the dielectric layers wherein through holes are formed by any $i^{th}$ etching operation, as represented by one or more of (○'s. When the "number of layers for through holes" is 5, a combination (i=1, 4) represented by x's is allowable besides any combination (i=2, 3) represented by one or more of (○'s.

TABLE 4

| Etching operation | The number of layers for through holes ($a_i$) | | | | | | |
|---|---|---|---|---|---|---|---|
| No. (i) | The number ($a_i$) of layers | 1 | 2 | 3 | 4 | 5 | 6 | 7 |
| 1 | 1 | ○ | | | | x | | |
| 2 | 2 | | ○ | | | ○ | ○ | |
| 3 | 3 | | | ○ | | ○ | | ○ |
| 4 | 4 | | | | ○ | x | ○ | |

When etching operations are combined as described above, the number of photolithographic steps and that of etching steps can be made remarkably smaller than when through holes are made to be processed in an amount corresponding to one electrode layer and one dielectric layer in each step. Thus, production costs can be reduced. Moreover, when etching is conducted k times, a thin film laminated capacitor containing capacitor elements the number of which is at most ($2^k-1$) can be formed.

The present invention is not limited to the above-mentioned embodiments, and the embodiments may be carried out in the state that the embodiments may be variously modified or changed.

The invention claimed is:

1. A method for producing a thin film laminated capacitor, the method comprising:
   forming a capacitor part in which n electrode layers and (n−1) dielectric layers are alternately laminated onto each other, wherein n is a natural number of 4 or more;
   etching the capacitor part k times from one side of a lamination direction of the capacitor part, wherein k is a natural number of two or more;
   making, in any $i^{th}$ etching operation, through holes in the electrode layers and the dielectric layers in an amount corresponding to respective $a_i$ layers out of the electrode layers and the dielectric layers, wherein i=1, 2, ... k and wherein $a_i$ is a natural number of one or more;
   setting at least one $a_i$ of the elements $a_i$'s to a natural number of two or more, wherein i=1, 2, ... k;
   making k smaller than n−1 such that each of a second and higher-order electrode layers from the one side of the lamination direction in the capacitor part are exposed; and
   connecting the exposed second and exposed higher-order electrode layers electrically to external electrodes through one or more of the through holes.

2. The method for producing a thin film laminated capacitor according to claim 1, wherein a selection is made in such a manner that all natural numbers from 1 to (n−1) can each be represented by one element $a_p$, wherein p is a natural number of k or less selected from a group X of the elements $a_i$'s, X{$a_1$, $a_2$, ... $a_k$}, and further k becomes a minimum value; and
   in the etching step, the $(a_p+1)^{th}$ electrode layer from the one side of the lamination direction is exposed at the bottom surface of the one or more through hole formed by only the $p^{th}$ etching operation corresponding to the element $a_p$; whereby the second and the higher-order electrode layers from the one side of the lamination direction are each exposed.

3. The method for producing a thin film laminated capacitor according to claim 1, wherein a selection is made in such a manner that all natural numbers from 1 to (n−1) can each be represented by a summation of two or more elements $a_q$'s, $\Sigma a_q = m$ wherein m is a natural number, wherein each q is a natural number of k or less, and further k becomes a minimum value; and
   in the etching step, the through holes formed by the $q^{th}$ etching operations, respectively, which correspond to the two or more elements $a_q$'s making the summation $\Sigma a_q$ equal to m, are at least partially connected to each other; and the $(m+1)^{th}$ electrode layer from the one side of the lamination direction is exposed at the bottom surfaces of the through holes connected to each other; whereby the second and the higher-order electrode layers from the one side of the lamination direction are each exposed.

4. The method for producing a thin film laminated capacitor according to claim 1, wherein $a_1, a_2, \ldots, a_k$ are selected so as to make it possible to represent each of all natural numbers from 1 to (n−1) by one element $a_j$ or two element $a_j$'s selected from the group X of the elements $a_i$'s, X{$a_1, a_2, \ldots, a_k$}.

5. The method for producing a thin film laminated capacitor according to claim 1, wherein in the etching step, the layer number of the electrode layers and the dielectric layers in which one or more of the through holes are made in any one of the second and the higher-order etching operations is equal to or more than the layer number of the electrode layers and the dielectric layers in which one or more of the through holes are formed by each of the etching operations before the above-mentioned etching operation.

6. The method for producing a thin film laminated capacitor according to claim 1, wherein in each of the etching operations in the etching step, the same etching liquid is used for both of the electrode layers and the dielectric layers to form one or more of the through holes continuously.

7. The method for producing a thin film laminated capacitor according to claim 1, wherein a thickness of the electrode layers other than the electrode layer farthest from the one side of the lamination direction are equal to each other, and a thickness of the dielectric layers are equal to each other.

\* \* \* \* \*